United States Patent
Qi et al.

(10) Patent No.: US 12,360,084 B2
(45) Date of Patent: Jul. 15, 2025

(54) HIGH-SENSITIVITY MAGNETORESISTIVE ACOUSTIC WAVE SENSOR AND ARRAY DEVICE

(71) Applicant: MultiDimension Technology Co., Ltd., Zhangjiagang (CN)

(72) Inventors: Bin Qi, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 736 days.

(21) Appl. No.: 17/753,358

(22) PCT Filed: Aug. 18, 2020

(86) PCT No.: PCT/CN2020/109764
§ 371 (c)(1),
(2) Date: Aug. 30, 2022

(87) PCT Pub. No.: WO2021/036861
PCT Pub. Date: Mar. 4, 2021

(65) Prior Publication Data
US 2022/0397557 A1  Dec. 15, 2022

(30) Foreign Application Priority Data
Aug. 28, 2019 (CN) .......................... 201910803646.6

(51) Int. Cl.
*G01N 29/24* (2006.01)
*G01R 33/09* (2006.01)

(52) U.S. Cl.
CPC ......... *G01N 29/2412* (2013.01); *G01R 33/09* (2013.01)

(58) Field of Classification Search
CPC ..... G01N 29/2412; G01R 33/09; G01H 11/02
See application file for complete search history.

(56) References Cited

U.S. PATENT DOCUMENTS 4,840,183 A   6/1989  Takahashi et al.
6,507,187 B1 * 1/2003  Olivas .................. G01P 15/105
                                                324/252

(Continued)

FOREIGN PATENT DOCUMENTS

CN   201025449 Y   2/2008
CN   101251409 A   8/2008

(Continued)

OTHER PUBLICATIONS

"Chinese Application No. 201910803646.6, Chinese Search Report dated Jan. 8, 2021", (Jan. 8, 2021), 2 pgs.

(Continued)

*Primary Examiner* — Andrea Lindgren Baltzell
*Assistant Examiner* — Kimberly E Glenn
(74) *Attorney, Agent, or Firm* — Schwegman Lundberg & Woessner, P.A.

(57) ABSTRACT

A magnetoresistive acoustic wave sensor with high sensitivity and an array device thereof is disclosed, in which a magnetoresistive acoustic wave sensor comprises a protective tube shell, a magnetic vibration assembly, and a magnetoresistive chip located inside the protective tube shell. The protective tube shell comprises at least one opening which is covered by the magnetic vibration assembly. The plane where the magnetoresistive sensor chip is located is perpendicular to the plane where the magnetic vibration assembly is located, and the sensing direction of the magnetoresistive sensor chip is located in the plane where magnetoresistive sensor chip is located, and is perpendicular to or parallel to the plane where the magnetic vibration assembly is located. Alternatively, the plane where the magnetoresistive sensor chip is located is parallel to the plane where the magnetic vibration assembly is located, and the sensing direction of the magnetoresistive sensor chip is (Continued)

located in the plane where the magnetoresistive sensor chip is located, and is parallel to the plane where the magnetic vibration assembly is located. The magnetoresistive acoustic wave sensor with high sensitivity and an array device thereof is of small size, high sensitivity, low power consumption, high response speed, good stable temperature, large response frequency bandwidth, excellent low-frequency response and the like.

18 Claims, 6 Drawing Sheets

(56) References Cited

U.S. PATENT DOCUMENTS

| | | | |
|---|---|---|---|
| 11,940,299 B2* | 3/2024 | Qi | G01R 33/09 |
| 2002/0178831 A1 | 12/2002 | Takada | |
| 2007/0268017 A1 | 11/2007 | Dietzel et al. | |
| 2015/0082888 A1 | 3/2015 | Otsu et al. | |

FOREIGN PATENT DOCUMENTS

| | | |
|---|---|---|
| CN | 102353951 A | 2/2012 |
| CN | 103894306 A | 7/2014 |
| CN | 104180849 A | 12/2014 |
| CN | 104729768 A | 6/2015 |
| CN | 109327770 A | 2/2019 |
| CN | 110440872 A | 11/2019 |
| CN | 110455401 A | 11/2019 |
| WO | WO-2021036861 A1 | 3/2021 |

OTHER PUBLICATIONS

"Chinese Application No. 201910803646.6, First Office Action mailed Jan. 18, 2021", (Jan. 18, 2021), 15 pgs.

"Chinese Application No. 201910803646.6, Notification to Grant Patent Right for Invention mailed Jul. 26, 2021", (Jul. 26, 2021), 2 pgs.

"International Application No. PCT/CN2020/109764, International Search Report and Written Opinion mailed Oct. 28, 2020", (Oct. 28, 2020), 10 pgs.

* cited by examiner

HIGH-SENSITIVITY MAGNETORESISTIVE ACOUSTIC WAVE SENSOR AND ARRAY DEVICE

PRIORITY CLAIM TO RELATED APPLICATIONS

This application is a U.S. national stage filing under 35 U.S.C. § 371 from International Application No. PCT/CN2020/109764, filed on 18 Aug. 2020, and published as WO2021/036861 on 4 Mar. 2021, which claims the benefit under 35 U.S.C. 119 to Chinese Application No. 201910803646.6, filed on 28 Aug. 2019, the benefit of priority of each of which is claimed herein, and which applications and publication are hereby incorporated herein by reference in their entirety.

TECHNICAL FIELD

Embodiments of the present invention relate to the technical field of acoustic wave detection, and more particularly, to a magnetoresistive acoustic wave sensor with high sensitivity and an array device thereof.

BACKGROUND

An acoustic wave sensor is a device that converts an acoustic wave signal into an electrical signal, which can measure the strength of an acoustic wave and display a waveform of the acoustic wave. As a main device of an acoustic wave sensing technology, the acoustic wave sensor is widely used for research and application in the fields of formation, transmission, receiving, transformation, processing and the like of acoustic wave information.

At present, the acoustic wave sensor is commonly used to convert acoustic wave or pressure variations in environmental water to be detected into electrical signals for detection and analysis. The existing acoustic wave sensors mainly include optical fiber acoustic wave sensors, piezoelectric acoustic wave sensors and silicon-based capacitive acoustic wave sensors under an MEMS technology. The optical fiber acoustic wave sensors are of excellent temperature stability and time stability, high sensitivity, but with high power consumption, large size and poor low-frequency response. The piezoelectric acoustic wave sensors are of large response frequency bandwidth, easy processing, small size and stable structure, but with poor temperature stability and low sensitivity for the same size. The silicon-based capacitive acoustic wave sensors under an MEMS technology are of small size, low power consumption, good temperature stability, but high noise and small response frequency bandwidth.

SUMMARY

The present invention provides a magnetoresistive acoustic wave sensor with high sensitivity and an array device thereof, so as to be of small size, high sensitivity, low power consumption, high response speed, good temperature stability, large response frequency bandwidth, excellent low-frequency response and the like.

Embodiments of the present invention provide a magnetoresistive acoustic wave sensor with high sensitivity, including:

a protective tube shell, a magnetic vibration assembly, and a magnetoresistive chip located inside the protective tube shell.

The protective tube shell includes at least one opening which is covered by the magnetic vibration assembly.

The magnetic vibration assembly is configured to receive an external acoustic wave signal and convert the acoustic wave signal into a magnetic signal about a magnetic field variation.

The magnetoresistive chip is configured to sense the magnetic field variation, convert the magnetic field variation into a magnetoresistive resistance value variation and perform signal output.

The plane where the magnetoresistive chip is located is perpendicular to the plane where the magnetic vibration assembly is located, and the sensing direction of the magnetoresistive chip is located in the plane where the magnetoresistive chip is located, and is perpendicular to or parallel to the plane where the magnetic vibration assembly is located.

Alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located.

Optionally, the magnetic vibration assembly includes a vibration diaphragm and a permanent magnetic material body, and the permanent magnetic material body is a permanent magnetic material layer and is attached to a surface of the vibration diaphragm. Alternatively, the permanent magnetic material body is permanent magnetic material powder and is uniformly distributed in the vibration diaphragm.

The magnetizing direction of the permanent magnetic material body is perpendicular to or parallel to the plane where the vibration diaphragm is located.

Optionally, the permanent magnetic material body is a hard magnetic material or a multi-layer thin-film composite unit composed of multiple hard magnetic materials. Alternatively, the permanent magnetic material body is a multi-layer thin-film composite material of [soft magnetic material/antiferromagnetic material]$_n$. Alternatively, the permanent magnetic material body is a multi-layer thin-film composite material of [soft magnetic material/hard magnetic material]$_p$, where n and p are both natural numbers.

Optionally, the magnetic vibration assembly further includes a protective layer located on a surface of the vibration diaphragm away from the permanent magnetic material layer.

Optionally, composition materials of the vibration diaphragm in the magnetic vibration assembly include a high-molecular polymer, metal, silicon, or a silicon compound.

Optionally, a counterweight body or counterweight liquid for adjusting the equivalent density of the magnetoresistive acoustic wave sensor with high sensitivity is provided inside the protective tube shell.

Optionally, a signal processing unit, a data transmission unit, a power supply unit and a circuit board are further included.

The signal processing unit, the data transmission unit, the power supply unit and the magnetoresistive chip are all electrically connected to the circuit board.

The signal processing unit is configured to process an output signal of the magnetoresistive chip. The data transmission unit is configured to transmit an output signal of the magnetoresistive chip and/or a signal processed by the signal processing unit. The power supply unit is configured to supply power to the signal processing unit, the data transmission unit and the magnetoresistive chip. The circuit board is configured to carry the signal processing unit, the data transmission unit and the magnetoresistive chip.

Optionally, the protective tube shell further includes a waterproof port through which the circuit board is electrically connected to an external device.

Embodiments of the present invention also provide an array device of a magnetoresistive acoustic wave sensor with high sensitivity, including a plurality of any magnetoresistive acoustic wave sensors with high sensitivity described above, which are arranged in an array in any plane or in an array in any spherical plane.

According to the technical solution provided by the embodiments of the present invention, the vibration of a magnetic vibration diaphragm caused by sound or vibration is converted into a magnetic field amplitude fluctuation or gradient variation by the magnetic vibration diaphragm, and the magnetic field amplitude fluctuation or gradient variation is converted into an electrical signal in combination with a magnetoresistive chip with high sensitivity, so as to accurately obtain an acoustic wave or vibration signal to be measured. The magnetoresistive chip is of fast response and high sensitivity to an external magnetic field variation, low power consumption, small size and excellent temperature characteristics, which helps to improve the output signal strength and frequency response of the magnetoresistive acoustic wave sensor with high sensitivity, thereby solving the technical problems of poor low-frequency response, small response frequency bandwidth and difficult integration between sensitivity and power consumption or size of an acoustic wave sensor at present, and achieving a magnetoresistive acoustic wave sensor with high sensitivity which is of small size, high sensitivity, low power consumption, high response speed, good temperature stability, large response frequency bandwidth, excellent low-frequency response and the like.

DETAILED DESCRIPTION

The present invention will now be described in further detail with reference to the accompanying drawings and embodiments. It should be understood that specific embodiments described herein are illustrative only and are not restrictive for the present invention. It should also be noted that, for ease of description, only some, but not all, of the structures associated with the present invention are shown in the drawings.

Figure 1:
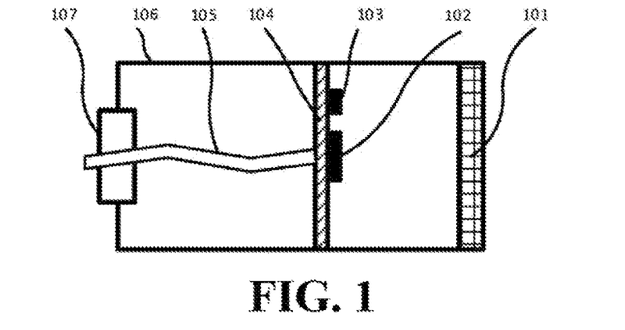
FIG. 1 is a schematic cross-sectional structure diagram of a magnetoresistive acoustic wave sensor with high sensitivity according to embodiments of the present invention.
Figure 2:
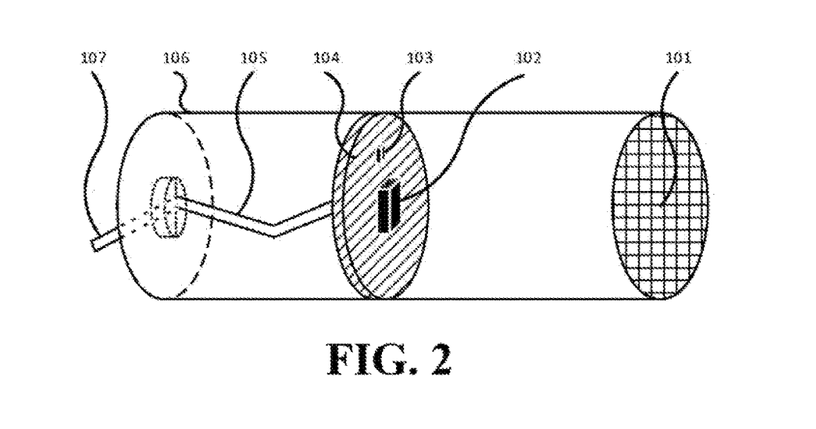
FIG. 2 is a schematic stereostructure diagram of a magnetoresistive acoustic wave sensor with high sensitivity according to embodiments of the present invention.

FIG. 1 is a schematic cross-sectional structure diagram of a magnetoresistive acoustic wave sensor with high sensitivity according to embodiments of the present invention. FIG. 2 is a schematic stereostructure diagram of a magnetoresistive acoustic wave sensor with high sensitivity according to embodiments of the present invention. As shown in FIGS. 1 and 2, the magnetoresistive acoustic wave sensor with high sensitivity provided by the embodiments includes: a protective tube shell 106, a magnetic vibration assembly 101, and a magnetoresistive chip 102 located inside the protective tube shell 106. The protective tube shell 106 includes at least one opening which is covered by the magnetic vibration assembly 101. The magnetic vibration assembly 101 is configured to receive an external acoustic wave signal and convert the acoustic wave signal into a magnetic signal about a magnetic field variation. The magnetoresistive chip 102 is configured to sense the magnetic field variation, convert the magnetic field variation into a magnetoresistive resistance value variation and perform signal output. The plane where the magnetoresistive chip 102 is located is perpendicular to the plane where the magnetic vibration assembly 101 is located, the sensing direction of the magnetoresistive chip 102 is located in the plane where the magnetoresistive chip 102 is located, and the sensing direction of the magnetoresistive chip 102 is perpendicular to or parallel to the plane where the magnetic vibration assembly 101 is located. Alternatively, the plane where the magnetoresistive chip 102 is located is parallel to the plane where the magnetic vibration assembly 101 is located, the sensing direction of the magnetoresistive chip 102 is located in the plane where the magnetoresistive chip 102 is located, and the sensing direction of the magnetoresistive chip 102 is parallel to the plane where the magnetic vibration assembly 101 is located.

The protective tube shell 106 may be of any shape, and the protective tube shell 106 may be provided with one or more open end faces. By way of example, referring to FIGS. 1 and 2, the protective tube shell 106 is cylindrical, the protective tube shell 106 is provided with an open end face, the sensing face of the magnetic vibration assembly 101 is circular, and the magnetic vibration assembly 101 covers the open end face of the protective tube shell 106. The plane where the magnetoresistive chip 102 is located is parallel to the plane where the magnetic vibration assembly 101 is located, the sensing direction of the magnetoresistive chip 102 is located in the plane where the magnetoresistive chip 102 is located, and the sensing direction of the magnetoresistive chip 102 is parallel to the plane where the magnetic vibration assembly 101 is located. Optionally, a sealing mode between the magnetic vibration assembly 101 and the protective tube shell 106 is one of adhesion, welding and snap-fit seals.

Figure 3:
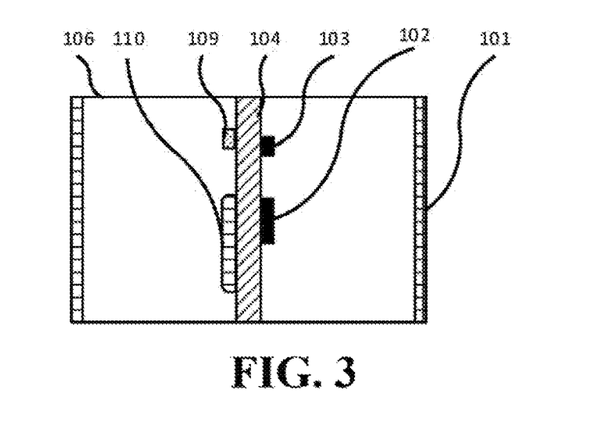
FIG. 3 is a schematic cross-sectional structure diagram of another magnetoresistive acoustic wave sensor with high sensitivity according to embodiments of the present invention.

FIG. 3 is a schematic cross-sectional structure diagram of another magnetoresistive acoustic wave sensor with high sensitivity according to embodiments of the present invention. In other embodiments, as shown in FIG. 3, the protective tube shell 106 is cylindrical, both ends of the protective tube shell 106 are provided with open end faces, the sensing face of the magnetic vibration assembly 101 is circular, and the magnetic vibration assembly 101 covers the open end faces on both ends of the protective tube shell 106. A sealing mode between the magnetic vibration assembly 101 and the protective tube shell 106 may be one of adhesion, welding and snap-fit seals. Alternatively, circular baffles are arranged on both ends of the protective tube shell 106, and each centrally include a circular through hole, the sensing face of the magnetic vibration assembly 101 is circular, the magnetic vibration assembly 101 is located on the circular baffles, and the aperture of the circular through holes is less than or equal to the diameter of the sensing face of the magnetic vibration assembly 101. The connection between the circular baffles and a side wall of the protective tube shell 106 may be made by adhesion, welding or integral forming.

Figure 4:
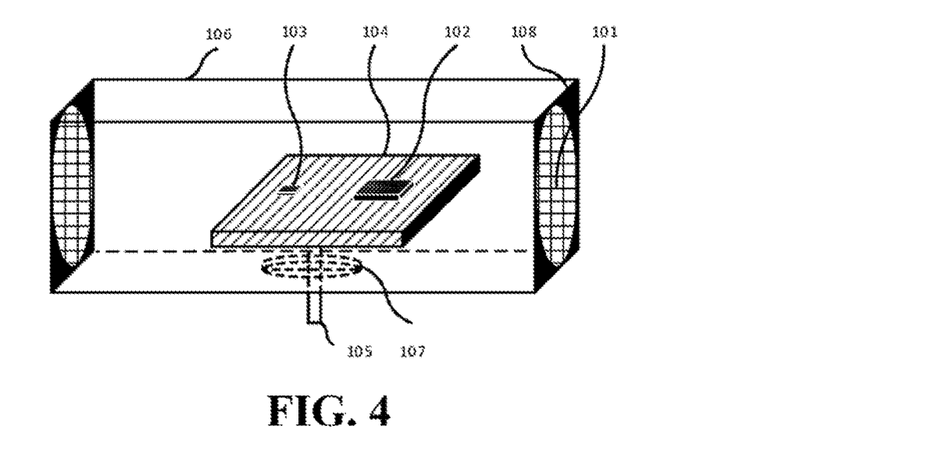
FIG. 4 is a schematic stereostructure diagram of another magnetoresistive acoustic wave sensor with high sensitivity according to embodiments of the present invention.

FIG. 4 is a schematic stereostructure diagram of another magnetoresistive acoustic wave sensor with high sensitivity according to embodiments of the present invention. In other embodiments, as shown in FIG. 4, the protective tube shell 106 is quadrangular, both ends of the protective tube shell 106 are provided with square baffles 108, the sensing face of the magnetic vibration assembly 101 is circular, the magnetic vibration assembly 101 is located on the square baffles 108, the square baffles 108 centrally include a circular through hole having an aperture less than or equal to the diameter of the sensing face of the magnetic vibration assembly 101, and the magnetoresistive chip 102 is located in the middle of the protective tube shell 106 and is arranged perpendicular to the magnetic vibration assembly 101. The sensing direction of the magnetoresistive chip 102 is located in the plane where the magnetoresistive chip 102 is located, and the sensing direction of the magnetoresistive chip 102 is perpendicular to or parallel to the plane where the magnetic vibration assembly 101 is located. The connection between the square baffles 108 and the side wall of the protective tube shell 106 may be one of adhesion, welding and integral forming. A sealing mode between the magnetic vibration assembly 101 and the protective tube shell 106 may be one of adhesion, welding and snap-fit seals.

According to the technical solution provided by the embodiments of the present invention, the vibration of the magnetic vibration assembly 101 caused by sound or vibration is converted into a magnetic field amplitude fluctuation or gradient variation by the magnetic vibration assembly 101, and the magnetic field amplitude fluctuation or gradient variation is converted into a magnetoresistive resistance value variation and signal output is performed in combination with the magnetoresistive chip 102 with high sensitivity, so as to accurately obtain an acoustic wave or vibration signal to be measured. The magnetoresistive chip 102 is of fast response and high sensitivity to an external magnetic field variation, low power consumption, small size and excellent temperature characteristics, which helps to improve the output signal strength and frequency response of the magnetoresistive acoustic wave sensor with high sensitivity, thereby solving the technical problems of poor low-frequency response, small response frequency bandwidth and difficult integration between sensitivity and power consumption or size of an acoustic wave sensor at present, and achieving a magnetoresistive acoustic wave sensor with high sensitivity which is of small size, high sensitivity, low power consumption, high response speed, good temperature stability, large response frequency bandwidth, excellent low-frequency response and the like.

Optionally, the magnetic vibration assembly 101 includes a vibration diaphragm 401 and a permanent magnetic material body, and the permanent magnetic material body is a permanent magnetic material layer 402 and is attached to a surface of the vibration diaphragm 401. Alternatively, the permanent magnetic material body is permanent magnetic material powder 403 and is uniformly distributed in the vibration diaphragm 401. The magnetizing direction of the permanent magnetic material body is perpendicular to or parallel to the plane where the vibration diaphragm 401 is located.

Figures 5, 6:
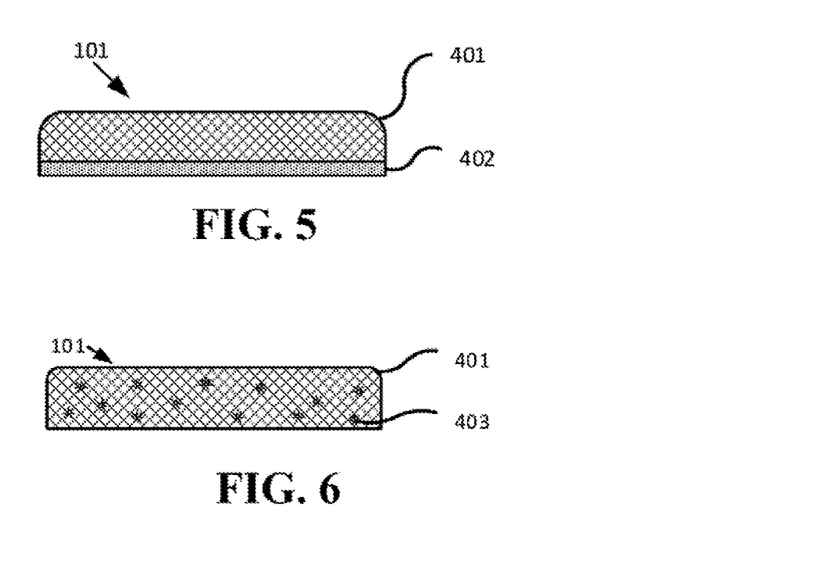
FIG. 5 is a schematic structure diagram of a magnetic vibration assembly according to embodiments of the present invention.
FIG. 6 is a schematic structure diagram of another magnetic vibration assembly according to embodiments of the present invention.

By way of example, FIG. 5 is a schematic structure diagram of a magnetic vibration assembly according to embodiments of the present invention. As shown in FIG. 5, a permanent magnetic material is spin-coated and adhered to the surface of the magnetic vibration assembly 101 to form a permanent magnetic material layer 402, and the magnetizing direction of the permanent magnetic material layer 402 is in the plane where the permanent magnetic material layer 402 is located or perpendicular to the plane where the permanent magnetic material layer 402 is located.

FIG. 6 is a schematic structure diagram of another magnetic vibration assembly according to embodiments of the present invention. In other embodiments, as shown in FIG. 6, the permanent magnetic material powder 403 is uniformly dispersed in the vibration diaphragm 401, and the magnetizing direction of the permanent magnetic material powder 403 is in the plane where the vibration diaphragm 401 is located or perpendicular to the plane where the vibration diaphragm 401 is located. Optionally, the permanent magnetic material may be provided in combination with the vibration diaphragm 401 by vapor deposition, electroplating, etc.

By means of the relationship between the magnetizing direction of the permanent magnetic material body and the vibration diaphragm 401, the magnetizing direction of the permanent magnetic material body matches the sensing direction of the magnetoresistive chip 102, thereby further improving the sensitivity of the magnetoresistive acoustic wave sensor with high sensitivity.

Optionally, the permanent magnetic material body is a hard magnetic material or a multi-layer thin-film composite unit composed of multiple hard magnetic materials. Alternatively, the permanent magnetic material body is a multi-layer thin-film composite material of [soft magnetic material/antiferromagnetic material]$_n$. Alternatively, the permanent magnetic material body is a multi-layer thin-film composite material of [soft magnetic material/hard magnetic material]$_p$, where n and p are both natural numbers.

n represents the number of layers of soft magnetic material and antiferromagnetic material, and p represents the number of layers of soft magnetic material and hard magnetic material.

Figure 7:
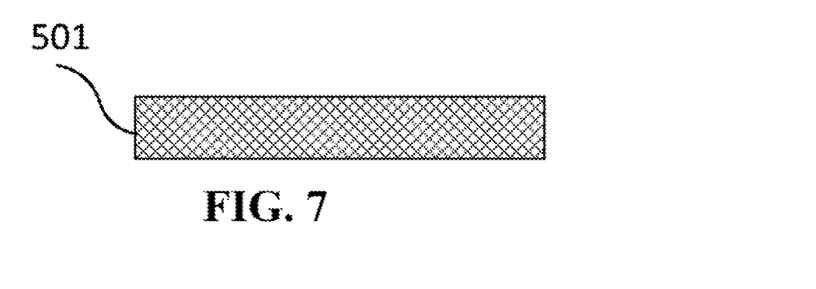
FIG. 7 is a schematic structure diagram of a permanent magnetic material body according to embodiments of the present invention.
Figure 8:
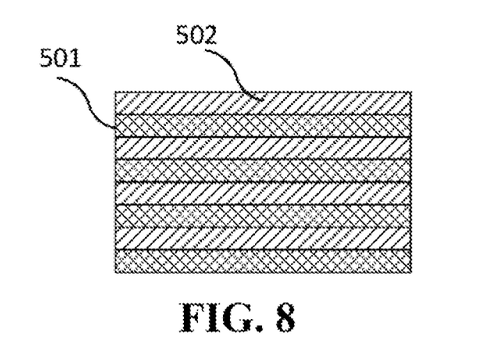
FIG. 8 is a schematic structure diagram of another permanent magnetic material body according to embodiments of the present invention.
Figure 9:
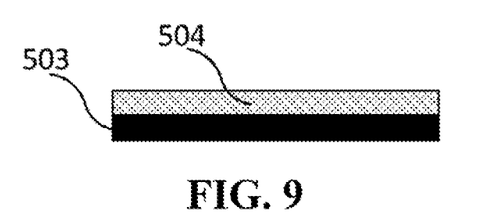
FIG. 9 is a schematic structure diagram of yet another permanent magnetic material body according to embodiments of the present invention.
Figure 10:
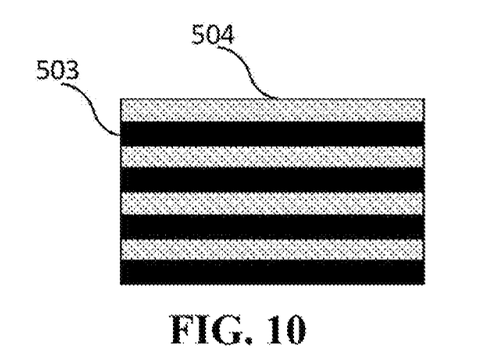
FIG. 10 is a schematic structure diagram of yet another permanent magnetic material body according to embodiments of the present invention.
Figure 11:
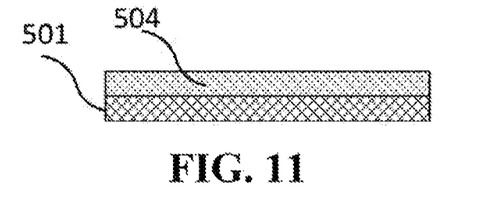
FIG. 11 is a schematic structure diagram of yet another permanent magnetic material body according to embodiments of the present invention.
Figure 12:
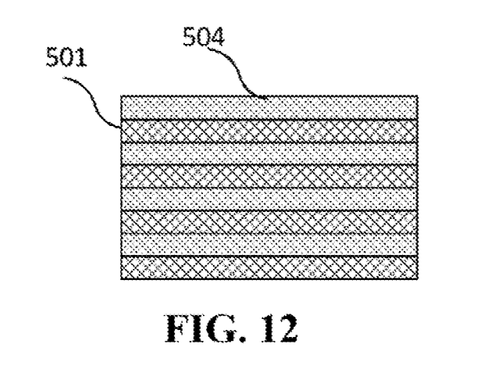
FIG. 12 is a schematic structure diagram of yet another permanent magnetic material body according to embodiments of the present invention.

By way of example, FIG. 7 is a schematic structure diagram of a permanent magnetic material body according to embodiments of the present invention. As shown in FIG. 7, the permanent magnetic material body is composed of single hard magnetic materials 501. FIG. 8 is a schematic structure diagram of another permanent magnetic material body according to embodiments of the present invention. As shown in FIG. 8, the permanent magnetic material body is a multi-layer thin-film composite unit formed by stacking first hard magnetic materials 501 and second hard magnetic materials 502. FIG. 9 is a schematic structure diagram of yet another permanent magnetic material body according to embodiments of the present invention. As shown in FIG. 9, the permanent magnetic material body is a thin-film composite unit composed of a layer of soft magnetic material 504 and a layer of antiferromagnetic material 503. FIG. 10 is a schematic structure diagram of yet another permanent magnetic material body according to embodiments of the present invention. As shown in FIG. 10, the permanent magnetic material body is a multi-layer thin-film composite unit composed of four layers of soft magnetic material 504 and four layers of antiferromagnetic material 503 arranged in an overlapping manner, and the multi-layer thin-film composite unit is represented as [soft magnetic material/antiferromagnetic material]$_4$. FIG. 11 is a schematic structure diagram of yet another permanent magnetic material body according to embodiments of the present invention. As shown in FIG. 11, the permanent magnetic material body is a thin-film composite unit composed of a layer of soft magnetic material 504 and a layer of hard magnetic material 501, and the thin-film composite unit is represented as [soft magnetic material/hard magnetic material]$_1$. FIG. 12 is a schematic structure diagram of yet another permanent magnetic material body according to embodiments of the present invention. As shown in FIG. 12, the permanent magnetic material body is a multi-layer thin-film composite unit composed of four layers of soft magnetic material 504 and four layers of hard magnetic material 501 arranged in an overlapping manner, and the multi-layer thin-film composite unit is represented as [soft magnetic material/hard magnetic material]$_4$.

Optionally, the hard magnetic material 501 includes, but is not limited to, CoPt, CoCrPt and FePt. The soft magnetic material 504 includes, but is not limited to, FeCo and NiFe. The antiferromagnetic material 503 includes, but is not limited to, PtMn and IrMn.

The residual magnetism of the soft magnetic material is relatively small, the residual magnetism of the hard magnetic material is relatively large, and the magnetic susceptibility of the antiferromagnetic material is close to zero. A person skilled in the art would have been able to set the material and the number of layers of the permanent magnetic material body according to actual requirements.

Optionally, the magnetic vibration assembly 101 further includes a protective layer 404. The protective layer 404 is located on a surface of the vibration diaphragm 401 away from the permanent magnetic material layer 402.

Figure 13:
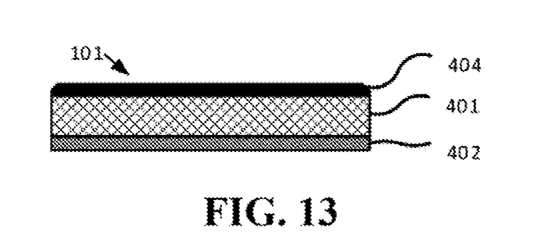
FIG. 13 is a schematic structure diagram of yet another magnetic vibration assembly according to embodiments of the present invention.
Figure 14:
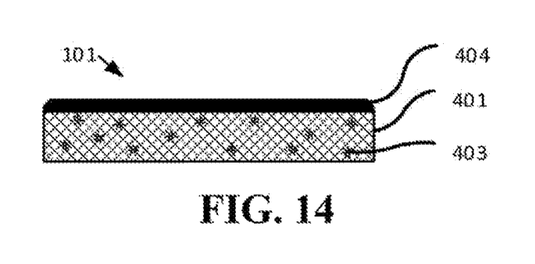
FIG. 14 is a schematic structure diagram of yet another magnetic vibration assembly according to embodiments of the present invention.

By way of example, FIG. 13 is a schematic structure diagram of yet another magnetic vibration assembly according to embodiments of the present invention. As shown in FIG. 13, an outer surface of the vibration diaphragm 401 away from the permanent magnetic material layer 402 is covered with the protective layer 404. FIG. 14 is a schematic structure diagram of yet another magnetic vibration assembly according to embodiments of the present invention. As shown in FIG. 14, the permanent magnetic material powder 403 is uniformly dispersed in the vibration diaphragm 401, and a surface of the vibration diaphragm 401 is closely adhered to the protective layer 404. By providing the protective layer 404 to protect the magnetic vibration assembly 101, it is ensured that the magnetoresistive acoustic wave sensor with high sensitivity can operate normally in a specific environment. Optionally, the protective layer 404 is a high molecular material or a corrosion resistant metallic material. The metallic material includes, but is not limited to, titanium, titanium alloys and stainless steel.

Optionally, composition materials of the vibration diaphragm 401 in the magnetic vibration assembly 101 include a high-molecular polymer, metal, silicon, or a silicon compound.

The use of such corrosion resistant materials helps to ensure normal operation of the magnetoresistive acoustic wave sensor with high sensitivity in liquid.

Optionally, a counterweight body 111 or counterweight liquid 112 for adjusting the equivalent density of the magnetoresistive acoustic wave sensor with high sensitivity is provided inside the protective tube shell 106.

Figure 15:
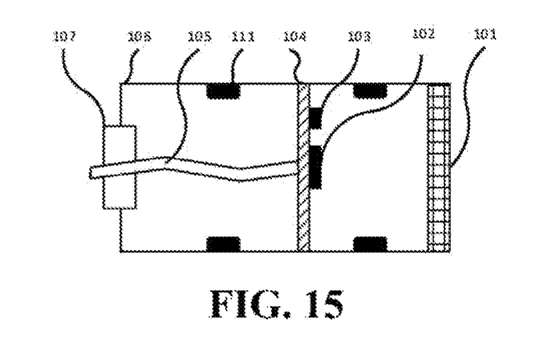
FIG. 15 is a schematic cross-sectional structure diagram of yet another magnetoresistive acoustic wave sensor with high sensitivity according to embodiments of the present invention.

By way of example, FIG. 15 is a schematic cross-sectional structure diagram of yet another magnetoresistive acoustic wave sensor with high sensitivity according to embodiments of the present invention. As shown in FIG. 15, the protective tube shell 106 of the magnetoresistive acoustic wave sensor with high sensitivity includes a cavity therein, and four counterweight bodies 111 are fixed to an inner side wall of the protective tube shell 106 to adjust the overall equivalent density of the magnetoresistive acoustic wave sensor with high sensitivity. The counterweight bodies 111 may be inert solids, and there may be one or more counterweight bodies 111.

Figure 16:
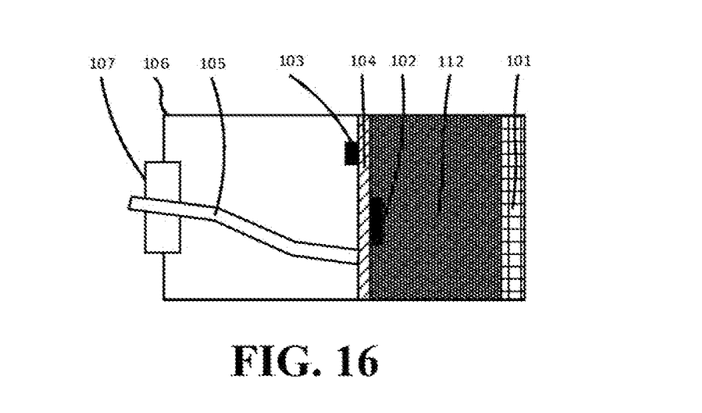
FIG. 16 is a schematic cross-sectional structure diagram of yet another magnetoresistive acoustic wave sensor with high sensitivity according to embodiments of the present invention.

FIG. 16 is a schematic cross-sectional structure diagram of yet another magnetoresistive acoustic wave sensor with high sensitivity according to embodiments of the present invention. As shown in FIG. 16, counterweight liquid 112 is filled into a counterweight cavity surrounded by the protective tube shell 106 and the magnetic vibration assembly 101 to adjust the overall equivalent density of the magnetoresistive acoustic wave sensor with high sensitivity. The counterweight liquid 112 may be non-corrosive insulating liquid.

Figure 17:
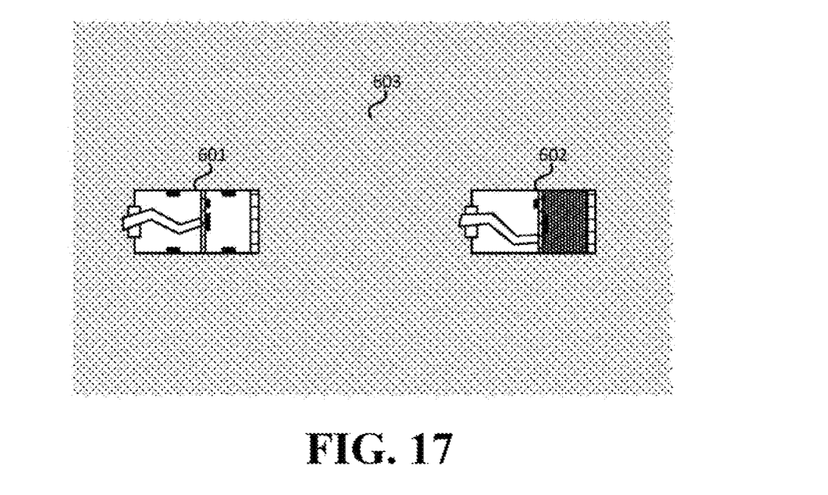
FIG. 17 is a schematic diagram of a magnetoresistive acoustic wave sensor with high sensitivity having a counterweight body and counterweight liquid respectively in measurement environment liquid.

FIG. 17 is a schematic diagram of a magnetoresistive acoustic wave sensor with high sensitivity having a counterweight body and counterweight liquid respectively in measurement environment liquid. As shown in FIG. 17, a magnetoresistive acoustic wave sensor with high sensitivity 601 provided with the counterweight body 111 and a magnetoresistive acoustic wave sensor with high sensitivity 602 provided with the counterweight liquid 112 may be kept stable at a set depth of measurement environment liquid 603.

According to the magnetoresistive acoustic wave sensor with high sensitivity provided by the embodiments of the present invention, the relative depth of the magnetoresistive acoustic wave sensor with high sensitivity in a liquid environment where it is installed is stabilized by providing the counterweight body 111 or the counterweight liquid 112 inside the protective tube shell 106 to ensure that the overall equivalent density of the magnetoresistive acoustic wave sensor with high sensitivity does not differ by more than 3% from the density of the liquid environment in which the magnetoresistive acoustic wave sensor with high sensitivity is installed when the magnetoresistive acoustic wave sensor with high sensitivity performs measurement in the liquid environment.

Referring to FIGS. 1-4, optionally, the magnetoresistive acoustic wave sensor with high sensitivity provided by the embodiments of the present invention further includes a signal processing unit 103, a data transmission unit 105, a power supply unit and a circuit board 104. The signal processing unit 103, the data transmission unit 105, the power supply unit and the magnetoresistive chip 102 are all electrically connected to the circuit board 104. The signal processing unit 103 is configured to process an output signal of the magnetoresistive chip. The data transmission unit 105 is configured to transmit an output signal of the magnetoresistive chip 102 and/or a signal processed by the signal processing unit 103. The power supply unit is configured to supply power to the signal processing unit 103, the data transmission unit 105 and the magnetoresistive chip 102. The circuit board 104 is configured to carry the signal processing unit 103, the data transmission unit 105 and the magnetoresistive chip 102.

The magnetoresistive chip 102, the signal processing unit 103 and the data transmission unit 105 are all arranged inside the protective tube shell 106 and are electrically connected to the circuit board 104, and the magnetic field variation generated by the vibration of the magnetic vibration assembly 101 causes the magnetoresistive resistance value variation of the magnetoresistive chip 102, thereby converting a mechanical motion induced by an acoustic wave into an electrical signal. The data transmission unit 105 transmits at least one of the output signal of the magnetoresistive chip 102 and the processed signal of the signal processing unit 103 to a receiving terminal.

Optionally, the data transmission unit 105 uses wireless transmission or wired transmission. The use of wireless transmission makes the magnetoresistive acoustic wave sensor with high sensitivity not limited by a connection line, and the use of wired transmission can improve the accuracy and real-time performance of data transmission.

By way of example, as shown in FIG. 3, the magnetoresistive chip 102, the signal processing unit 103 and the wireless data transmission unit 109 are all located on the circuit board 104 and electrically connected to the circuit board 104, and the power supply unit 110 is a battery, and is also fixed on a PCB and connected to the circuit board 104, so as to supply power to the magnetoresistive chip 102, the signal processing unit 103 and the wireless data transmission unit 109. The signal processing unit 103 may be a separate device or may be integrated inside the magnetoresistive chip 102, thereby further reducing the size of the magnetoresistive acoustic wave sensor with high sensitivity. The power supply unit 110 may be fixed on the circuit board 104 or may be arranged outside the magnetoresistive acoustic wave sensor with high sensitivity and electrically connected to the circuit board 104 through a lead wire.

Optionally, the processing of the electrical signal by the signal processing unit 103 includes one or more of the following processing modes: the output signal of the magnetoresistive chip 102 is subjected to modulation, filtering, amplification, analog-to-digital conversion, isolation, noise reduction, level conversion, output form conversion, etc.

Optionally, the signal processing unit 103 is one or more of integrated circuit chips such as a central processing unit (CPU), a Microcontroller Unit (MCU), a digital signal processor (DSP), an Application Specific Integrated Circuit (ASIC), an amplifier, a filter, and a comparator. Alternatively, the signal processing unit 103 is a circuit having the same function as the above-mentioned elements formed by discrete devices on the circuit board 104.

Optionally, the circuit board 104 is a Printed Circuit Board (PCB), which is small in size, low in cost, and convenient to maintain.

Figure 18:
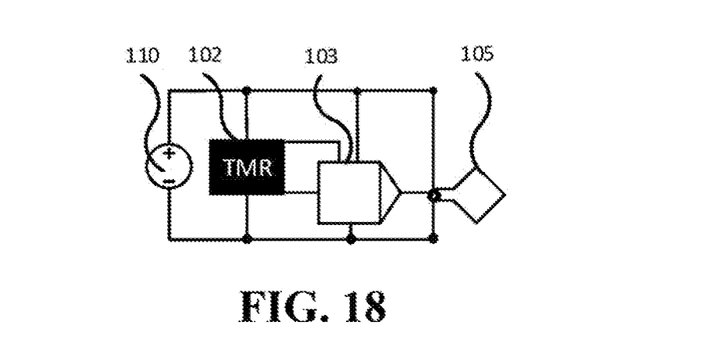
FIG. 18 is a schematic circuit diagram of a magnetoresistive acoustic wave sensor with high sensitivity according to embodiments of the present invention.

FIG. 18 is a schematic circuit diagram of a magnetoresistive acoustic wave sensor with high sensitivity according to embodiments of the present invention. As shown in FIG. 18, the magnetoresistive chip 102 (TMR) is electrically connected to an input end of the signal processing unit 103, and the data transmission unit 105 is electrically connected to an output end of the signal processing unit 103. An output signal of the output end of the signal processing unit 103 is in the form of current or voltage, and the output signal is in the form of an analog signal or a digital signal. The power supply unit 110 is arranged inside or outside the magnetoresistive acoustic wave sensor with high sensitivity, so as to supply power to the magnetoresistive chip 102 and the signal processing unit 103. If the wireless data transmission unit 105 is used, the power supply unit 110 may simultaneously supply power to the data transmission unit 105.

Optionally, the magnetoresistive chip 102 is any one of anisotropic magnetoresistive, giant magnetoresistive, and tunnel junction magnetoresistive chips. The magnetoresistive chip 102 may sense a magnetic signal of a magnetic field variation of the magnetic vibration assembly 101, convert the magnetic signal into a magnetoresistive resistance value variation and output the signal to the signal processing unit 103, and the signal processing unit 103 analyzes and processes the output signal of the magnetoresistive chip 102 and outputs a signal to the data transmission unit 105. The magnetoresistive chip 102 may output a signal in a single-ended output or differential output manner.

Referring to FIGS. 1 and 2, optionally, the protective tube shell 106 further includes a waterproof port 107 through which the circuit board 104 is electrically connected to an external device.

The power supply unit supplies power to an internal battery and/or supplies power through an external lead. If the power supply unit is an internal battery, the internal battery is arranged inside the protective tube shell 106. If the power supply unit is external and supplies power through an external lead, the external lead connected to the power supply unit is electrically connected to the circuit board 104 through the waterproof port 107 on the surface of the protective tube shell 106. Optionally, the waterproof port 107 is located on a side wall of the protective tube shell 106 or on an end face of the protective tube shell 106 that is not covered by the magnetic vibration assembly 101.

By way of example, as shown in FIG. 4, a side wall of the square protective tube shell 106 is provided with a waterproof port 107, an external lead is electrically connected to the circuit board 104 through the waterproof port 107, the magnetoresistive chip 102 and the signal processing unit 103 are both located on the circuit board 104, the external lead is configured to supply power and/or transmit data, and the data transmission unit 105 may be arranged outside the magnetoresistive acoustic wave sensor with high sensitivity and is electrically connected to the circuit board 104 through the external lead, so as to transmit an output signal of the magnetoresistive chip 102 and/or a signal processed by the signal processing unit 103 to an external device.

In other embodiments, as shown in FIGS. 1 and 2, the waterproof port 107 is located on an end face of the protective tube shell 106 which is not covered by the magnetic vibration assembly 101, and a person skilled in the art would have been able to set the position of the waterproof port 107 according to actual requirements.

Optionally, the protective tube shell 106 is a high molecular material or a corrosion resistant metallic material. The metallic material includes, but is not limited to, titanium, titanium alloys and stainless steel. The use of such corrosion resistant materials helps to ensure normal operation of the magnetoresistive acoustic wave sensor with high sensitivity in liquid.

The magnetoresistive acoustic wave sensor with high sensitivity provided by the embodiments of the present invention has a sealed structure for vibration and acoustic wave detection inside the liquid. By compounding a magnetic material with an elastic vibration diaphragm, the variation of sound, vibration or pressure in a test environment is converted into a magnetic field variation, and the magnetic field variation of the magnetic vibration diaphragm may cause the magnetoresistive resistance value variation of the magnetoresistive chip. By using the magnetoresistive chip as a sensing element, the mechanical motion of the magnetic vibration diaphragm is converted into an electrical signal so as to accurately obtain an acoustic wave or vibration signal to be measured. The magnetoresistive chip has high sensitivity and high-frequency response characteristics, which improves the output signal strength and frequency response of the magnetoresistive acoustic wave sensor with high sensitivity, and is beneficial to the detection of micro-pressure, micro-sound and weak vibration in the test environment. The technical problems of poor low-frequency response, small response frequency bandwidth and difficult integration between sensitivity and power consumption or size of an acoustic wave sensor at present are solved, and a magnetoresistive acoustic wave sensor with high sensitivity which is of small size, high sensitivity, low power consumption, high response speed, good temperature stability, large response frequency bandwidth, excellent low-frequency response and the like is achieved.

Figure 19:
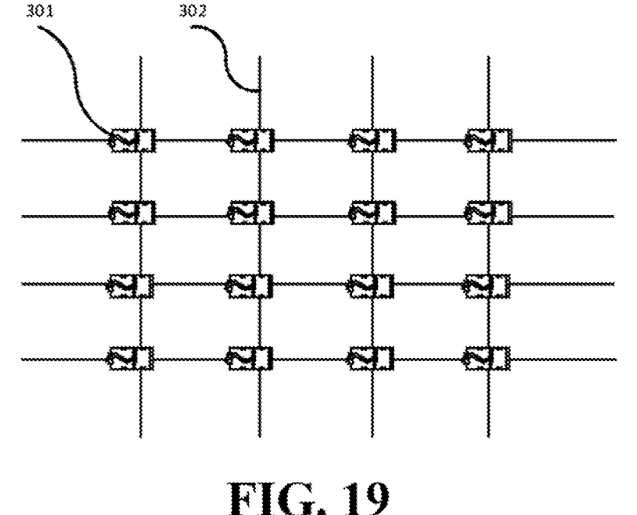
FIG. 19 is a schematic structure diagram of an array device of a magnetoresistive acoustic wave sensor with high sensitivity according to embodiments of the present invention.
Figure 20:
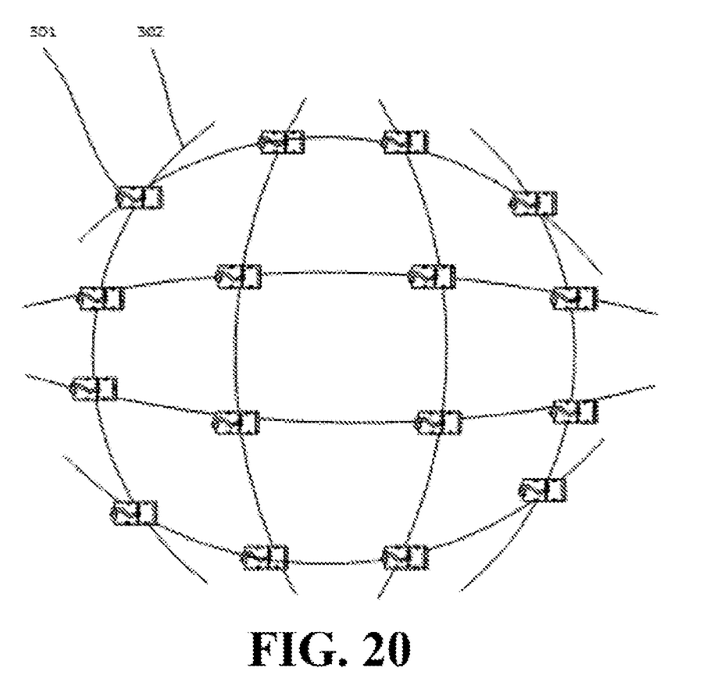
FIG. 20 is a schematic structure diagram of another array device of a magnetoresistive acoustic wave sensor with high sensitivity according to embodiments of the present invention.

Based on the same inventive concept, embodiments of the present invention also provide an array device of a magnetoresistive acoustic wave sensor with high sensitivity, including a plurality of any magnetoresistive acoustic wave sensors with high sensitivity provided in the above-mentioned plurality of embodiments. The same or corresponding structures as the above-mentioned embodiments and explanations of the terms are not described in detail herein. FIG. 19 is a schematic structure diagram of an array device of a magnetoresistive acoustic wave sensor with high sensitivity according to embodiments of the present invention. FIG. 20 is a schematic structure diagram of another array device of a magnetoresistive acoustic wave sensor with high sensitivity according to embodiments of the present invention. As shown in FIGS. 19 and 20, the plurality of magnetoresistive acoustic wave sensors with high sensitivity are arranged in an array in any plane or in an array in any spherical plane.

As shown in FIG. 19, the array device of a magnetoresistive acoustic wave sensor with high sensitivity includes an array of magnetoresistive acoustic wave sensors with high sensitivity, and magnetoresistive acoustic wave sensors with high sensitivity 301 which are orderly arranged in the array and an array connection line 302 are located in the same plane. In other embodiments, as shown in FIG. 20, the array device of a magnetoresistive acoustic wave sensor with high sensitivity includes an array of magnetoresistive acoustic wave sensors with high sensitivity, magnetoresistive acoustic wave sensors with high sensitivity 301 in the array are orderly arranged on a spherical curved surface, and the magnetoresistive acoustic wave sensors with high sensitivity 301 and an array connection line 302 are located on the same spherical plane, thereby facilitating accurate direction finding and positioning. Optionally, the array device of a magnetoresistive acoustic wave sensor with high sensitivity may also use an array of magnetoresistive acoustic wave sensors with high sensitivity in other networking modes. A person skilled in the art would have been able to perform networking setting on the magnetoresistive acoustic wave sensor with high sensitivity according to practical designs.

The array device of a magnetoresistive acoustic wave sensor with high sensitivity provided by the embodiments of the present invention may be used for sound and vibration measurement. A magnetic vibration assembly is obtained by compounding a vibration diaphragm with a permanent magnetic material, so that the variation of sound, vibration or pressure in a test environment is converted into a magnetic field variation, and then a magnetoresistive chip is used as a sensing element to convert the magnetic field variation into a magnetoresistive resistance value variation, thereby converting the mechanical motion of the magnetic vibration assembly into an electrical signal, and accurately obtaining an acoustic wave or vibration signal to be measured inside liquid. The magnetoresistive chip has high sensitivity and high-frequency response characteristics, can improve the output signal strength and frequency response of the array device of a magnetoresistive acoustic wave sensor with high sensitivity, and is beneficial to micro-pressure, micro-sound and weak vibration in the test environment. Meanwhile, the magnetoresistive chip is of low power consumption and small size, which is helpful to manufacture an array device of a magnetoresistive acoustic wave sensor with high sensitivity having a wireless and arrayed detection structure. In summary, according to the array device of a magnetoresistive acoustic wave sensor with high sensitivity provided by the embodiments of the present invention, the vibration of a magnetic vibration assembly caused by sound or vibration inside liquid is converted into a magnetic field amplitude fluctuation or gradient variation by the magnetic vibration assembly. With the characteristics of high response speed and high sensitivity of the resistance value of a magnetic resistance material in a magnetoresistive chip to an external magnetic field variation, the array device of a magnetoresistive acoustic wave sensor with high sensitivity has the advantages of high sensitivity, low power consumption, large response frequency bandwidth, excellent low-frequency response, suitability for large-scale networking and the like.

It should be noted that the above-mentioned descriptions are only preferred embodiments of the present invention and the technical principles applied thereto. It will be understood by a person skilled in the art that the present invention is not limited to the specific embodiments described herein, and that various obvious variations, rearrangements and substitutions can be made by a person skilled in the art without departing from the scope of the present invention. Therefore, while the present invention has been described in considerable detail with reference to the above embodiments, the present invention is not limited to the above embodiments, but it is intended to cover various other equivalent embodiments without departing from the spirit of the present invention, the scope of which is defined by the appended claims.

The invention claimed is:

1. A magnetoresistive acoustic wave sensor with high sensitivity, comprising:
    a protective tube shell;
    a magnetic vibration assembly; and
    a magnetoresistive chip located inside the protective tube shell,
    wherein
    the protective tube shell comprises at least one opening which is covered by the magnetic vibration assembly, and a counterweight body or counterweight liquid for adjusting the equivalent density of the magnetoresistive acoustic wave sensor with high sensitivity is provided inside the protective tube shell;
    the magnetic vibration assembly is configured to receive an external acoustic wave signal and convert the acoustic wave signal into a magnetic signal about a magnetic field variation;
    the magnetoresistive chip is configured to sense the magnetic field variation, convert the magnetic field variation into a magnetoresistive resistance value variation and perform signal output;
    a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; and
    alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located.

2. The magnetoresistive acoustic wave sensor with high sensitivity according to claim 1, wherein the magnetic vibration assembly comprises a vibration diaphragm and a permanent magnetic material body,
    the permanent magnetic material body is a permanent magnetic material layer and is attached to a surface of the vibration diaphragm, alternatively,
    the permanent magnetic material body is permanent magnetic material powder and is uniformly distributed in the vibration diaphragm,
    wherein the magnetizing direction of the permanent magnetic material body is perpendicular to or parallel to a plane where the vibration diaphragm is located.

3. The magnetoresistive acoustic wave sensor with high sensitivity according to claim 2, wherein the permanent magnetic material body is a hard magnetic material or a multi-layer thin-film composite unit composed of multiple hard magnetic materials; alternatively, the permanent magnetic material body is a multi-layer thin-film composite material of [soft magnetic material/antiferromagnetic material]$_n$; alternatively, the permanent magnetic material body is a multi-layer thin-film composite material of [soft magnetic material/hard magnetic material]$_p$, where n and p are both natural numbers.

4. The magnetoresistive acoustic wave sensor with high sensitivity according to claim 2, wherein the magnetic vibration assembly further comprises a protective layer located on a surface of the vibration diaphragm away from the permanent magnetic material layer.

5. The magnetoresistive acoustic wave sensor with high sensitivity according to claim 2, wherein composition materials of the vibration diaphragm in the magnetic vibration assembly comprise a high-molecular polymer, metal, silicon, or a silicon compound.

6. The magnetoresistive acoustic wave sensor with high sensitivity according to claim 1, further comprising a signal processing unit, a data transmission unit, a power supply unit and a circuit board, wherein
    the signal processing unit, the data transmission unit, the power supply unit and the magnetoresistive chip are all electrically connected to the circuit board;
    the signal processing unit is configured to process an output signal of the magnetoresistive chip;
    the data transmission unit is configured to transmit an output signal of the magnetoresistive chip and/or a signal processed by the signal processing unit; the power supply unit is configured to supply power to the signal processing unit, the data transmission unit and the magnetoresistive chip; and the circuit board is configured to carry the signal processing unit, the data transmission unit and the magnetoresistive chip.

7. The magnetoresistive acoustic wave sensor with high sensitivity according to claim 6, wherein the protective tube shell further comprises a waterproof port through which the circuit board is electrically connected to an external device.

8. An array device of a magnetoresistive acoustic wave sensor with high sensitivity, comprising a plurality of magnetoresistive acoustic wave sensors with high sensitivity according to claim 1, which are arranged in an array in any plane or in an array in any spherical plane.

9. A magnetoresistive acoustic wave sensor with high sensitivity, comprising:
    a protective tube shell;
    a magnetic vibration assembly; and
    a magnetoresistive chip located inside the protective tube shell,
    wherein
    the protective tube shell comprises at least one opening which is covered by the magnetic vibration assembly;
    the magnetic vibration assembly is configured to receive an external acoustic wave signal and convert the acoustic wave signal into a magnetic signal about a magnetic field variation;
    the magnetoresistive chip is configured to sense the magnetic field variation, convert the magnetic field variation into a magnetoresistive resistance value variation and perform signal output;
    a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located, wherein the magnetic vibration assembly comprises a vibration diaphragm and a permanent magnetic material body, the permanent magnetic material body is a permanent magnetic material layer and is attached to a surface of the vibration diaphragm, or alternatively, the permanent magnetic material body is permanent magnetic material powder and is uniformly distributed in the vibration diaphragm, and the magnetizing direction of the permanent magnetic material body is perpendicular to or parallel to a plane where the vibration diaphragm is located, and wherein the permanent magnetic material body is a hard magnetic material or a multi-layer thin-film composite unit composed of multiple hard magnetic materials; alternatively, the permanent magnetic material body is a multi-layer thin-film composite material of [soft magnetic material/antiferromagnetic material]$_n$; alternatively, the permanent magnetic material body is a multi-layer thin-film composite material of [soft magnetic material/hard magnetic material]$_p$, where n and p are both natural numbers.

10. A magnetoresistive acoustic wave sensor with high sensitivity, comprising:

a protective tube shell;
a magnetic vibration assembly; and
a magnetoresistive chip located inside the protective tube shell, wherein the protective tube shell comprises at least one opening which is covered by the magnetic vibration assembly;

the magnetic vibration assembly is configured to receive an external acoustic wave signal and convert the acoustic wave signal into a magnetic signal about a magnetic field variation;

the magnetoresistive chip is configured to sense the magnetic field variation, convert the magnetic field variation into a magnetoresistive resistance value variation and perform signal output;

a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located, wherein the magnetic vibration assembly comprises a vibration diaphragm and a permanent magnetic material body, the permanent magnetic material body is a permanent magnetic material layer and is attached to a surface of the vibration diaphragm, or alternatively, the permanent magnetic material body is permanent magnetic material powder and is uniformly distributed in the vibration diaphragm, and the magnetizing direction of the permanent magnetic material body is perpendicular to or parallel to a plane where the vibration diaphragm is located, and wherein the magnetic vibration assembly further comprises a protective layer located on a surface of the vibration diaphragm away from the permanent magnetic material layer.

11. A magnetoresistive acoustic wave sensor with high sensitivity, comprising:

a protective tube shell;
a magnetic vibration assembly; and
a magnetoresistive chip located inside the protective tube shell, wherein the protective tube shell comprises at least one opening which is covered by the magnetic vibration assembly;

the magnetic vibration assembly is configured to receive an external acoustic wave signal and convert the acoustic wave signal into a magnetic signal about a magnetic field variation;

the magnetoresistive chip is configured to sense the magnetic field variation, convert the magnetic field variation into a magnetoresistive resistance value variation and perform signal output;

a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located, wherein the magnetic vibration assembly comprises a vibration diaphragm and a permanent magnetic material body, the permanent magnetic material body is a permanent magnetic material layer and is attached to a surface of the vibration diaphragm, or alternatively, the permanent magnetic material body is permanent magnetic material powder and is uniformly distributed in the vibration diaphragm, and the magnetizing direction of the permanent magnetic material body is perpendicular to or parallel to a plane where the vibration diaphragm is located, and wherein composition materials of the vibration diaphragm in the magnetic vibration assembly comprise a high-molecular polymer, metal, silicon, or a silicon compound.

12. A magnetoresistive acoustic wave sensor with high sensitivity, comprising:

a protective tube shell;
a magnetic vibration assembly; and
a magnetoresistive chip located inside the protective tube shell, wherein the protective tube shell comprises at least one opening which is covered by the magnetic vibration assembly;

the magnetic vibration assembly is configured to receive an external acoustic wave signal and convert the acoustic wave signal into a magnetic signal about a magnetic field variation;

the magnetoresistive chip is configured to sense the magnetic field variation, convert the magnetic field variation into a magnetoresistive resistance value variation and perform signal output;

a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located, further comprising a signal processing unit, a data transmission unit, a power supply unit and a circuit board, wherein the signal processing unit, the data transmission unit, the power supply unit and the magnetoresistive chip are all electrically connected to the circuit board;

the signal processing unit is configured to process an output signal of the magnetoresistive chip;

the data transmission unit is configured to transmit an output signal of the magnetoresistive chip and/or a signal processed by the signal processing unit;

the power supply unit is configured to supply power to the signal processing unit, the data transmission unit and the magnetoresistive chip; and the circuit board is configured to carry the signal processing unit, the data transmission unit and the magnetoresistive chip.

13. The magnetoresistive acoustic wave sensor with high sensitivity according to claim 12, wherein the protective tube shell further comprises a waterproof port through which the circuit board is electrically connected to an external device.

14. The magnetoresistive acoustic wave sensor with high sensitivity according to claim 12, wherein the magnetic vibration assembly comprises a vibration diaphragm and a permanent magnetic material body, the permanent magnetic material body is a permanent magnetic material layer and is attached to a surface of the vibration diaphragm, alternatively, the permanent magnetic material body is permanent magnetic material powder and is uniformly distributed in the vibration diaphragm, wherein the magnetizing direction of the permanent magnetic material body is perpendicular to or parallel to a plane where the vibration diaphragm is located.

15. An array device of a magnetoresistive acoustic wave sensor with high sensitivity, comprising a plurality of magnetoresistive acoustic wave sensors with high sensitivity, which are arranged in an array in any plane or in an array in any spherical plane, wherein each of the plurality of magnetoresistive acoustic wave sensors include:

a protective tube shell;
a magnetic vibration assembly; and
a magnetoresistive chip located inside the protective tube shell, wherein the protective tube shell comprises at least one opening which is covered by the magnetic vibration assembly;

the magnetic vibration assembly is configured to receive an external acoustic wave signal and convert the acoustic wave signal into a magnetic signal about a magnetic field variation;

the magnetoresistive chip is configured to sense the magnetic field variation, convert the magnetic field variation into a magnetoresistive resistance value variation and perform signal output; and a plane where the magnetoresistive chip is located is perpendicular to a plane where the magnetic vibration assembly is located, and a sensing direction of the magnetoresistive chip is located in the plane where the magnetoresistive chip is located, and is perpendicular to or parallel to the plane where the magnetic vibration assembly is located; alternatively, the plane where the magnetoresistive chip is located is parallel to the plane where the magnetic vibration assembly is located, and the sensing direction of the magnetoresistive chip is located in the plane where the magnetoresistive chip is located, and is parallel to the plane where the magnetic vibration assembly is located.

16. The array device according to claim 15, wherein each of the plurality of magnetoresistive acoustic wave sensors further comprise a signal processing unit, a data transmission unit, a power supply unit and a circuit board, wherein the signal processing unit, the data transmission unit, the power supply unit and the magnetoresistive chip are all electrically connected to the circuit board;

the signal processing unit is configured to process an output signal of the magnetoresistive chip;

the data transmission unit is configured to transmit an output signal of the magnetoresistive chip and/or a signal processed by the signal processing unit; the power supply unit is configured to supply power to the signal processing unit, the data transmission unit and the magnetoresistive chip; and the circuit board is configured to carry the signal processing unit, the data transmission unit and the magnetoresistive chip.

17. The array device according to claim 16, wherein the protective tube shell further comprises a waterproof port through which the circuit board is electrically connected to an external device.

18. The array device according to claim 15, wherein the magnetic vibration assembly comprises a vibration diaphragm and a permanent magnetic material body, the permanent magnetic material body is a permanent magnetic material layer and is attached to a surface of the vibration diaphragm;

alternatively, the permanent magnetic material body is permanent magnetic material powder and is uniformly distributed in the vibration diaphragm, wherein the magnetizing direction of the permanent magnetic material body is perpendicular to or parallel to a plane where the vibration diaphragm is located.

* * * * *

UNITED STATES PATENT AND TRADEMARK OFFICE
CERTIFICATE OF CORRECTION

| | | |
|---|---|---|
| PATENT NO. | : 12,360,084 B2 | Page 1 of 1 |
| APPLICATION NO. | : 17/753358 | |
| DATED | : July 15, 2025 | |
| INVENTOR(S) | : Qi et al. | |

It is certified that error appears in the above-identified patent and that said Letters Patent is hereby corrected as shown below:

In the Claims

In Column 13, Line 58, in Claim 2, delete "diaphragm," and insert --diaphragm;¶-- therefor In Column 17, Line 50, in Claim 14, delete "diaphragm," and insert --diaphragm;-- therefor Signed and Sealed this
Sixteenth Day of September, 2025

Coke Morgan Stewart
*Acting Director of the United States Patent and Trademark Office*